(12) United States Patent
Sikka et al.

(10) Patent No.: US 10,424,527 B2
(45) Date of Patent: Sep. 24, 2019

(54) ELECTRONIC PACKAGE WITH TAPERED PEDESTAL

(71) Applicant: International Business Machines Corporation, Armonk, NY (US)

(72) Inventors: Kamal K. Sikka, Poughkeepsie, NY (US); Hilton T. Toy, Hopewell Junction, NY (US); Krishna R. Tunga, Wappingers Falls, NY (US); Thomas Weiss, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/812,290

(22) Filed: Nov. 14, 2017

(65) Prior Publication Data

US 2019/0148260 A1    May 16, 2019

(51) Int. Cl.
*H01L 23/36* (2006.01)
*H01L 23/367* (2006.01)
*H01L 23/00* (2006.01)
*H01L 23/10* (2006.01)
*H01L 23/053* (2006.01)

(52) U.S. Cl.
CPC ........ *H01L 23/3675* (2013.01); *H01L 23/053* (2013.01); *H01L 23/10* (2013.01); *H01L 24/32* (2013.01); *H01L 24/83* (2013.01); *H01L 24/16* (2013.01); *H01L 24/73* (2013.01); *H01L 24/81* (2013.01); *H01L 24/92* (2013.01); *H01L 2224/16225* (2013.01); *H01L 2224/32225* (2013.01); *H01L 2224/32245* (2013.01); *H01L 2224/73253* (2013.01); *H01L 2224/81815* (2013.01); *H01L 2224/83815* (2013.01); *H01L 2224/9221* (2013.01); *H01L 2924/1432* (2013.01); *H01L 2924/3511* (2013.01)

(58) Field of Classification Search
CPC ................ H01L 23/473; H01L 25/0657
See application file for complete search history.

(56) References Cited

U.S. PATENT DOCUMENTS

| 5,841,194 | A | 11/1998 | Tsukamoto |
| 5,940,271 | A | 8/1999 | Mertol |
| 5,949,137 | A | 9/1999 | Domadia et al. |
| 6,528,892 | B2 | 3/2003 | Caletka et al. |
| 6,903,278 | B2 | 6/2005 | Sathe |
| 7,245,500 | B2 | 7/2007 | Khan et al. |
| 7,279,789 | B2 | 10/2007 | Cheng |

(Continued)

*Primary Examiner* — Caridad Everhart
*Assistant Examiner* — Ankush K Singal
(74) *Attorney, Agent, or Firm* — Peter J. Edwards (57) ABSTRACT

An electrical package may comprise a first substrate with a first substrate surface, and a microprocessor chip connected to the first substrate surface. The microprocessor chip may comprise a first chip surface that electrically connects to the first substrate surface, and a second chip surface located opposite the first chip surface. The electrical package may comprise a heat spreader assembly that comprises a lid section and a contact surface thermally connected to the second-chip surface. The electrical package may also comprise a pedestal between the contact surface and the lid section. The pedestal may comprise a first end that is located near the contact surface and a second end that is located near the lid section. The second end may be wider than the first end.

20 Claims, 8 Drawing Sheets

(56) References Cited

U.S. PATENT DOCUMENTS

| | | | |
|---|---|---|---|
| 7,790,511 B2* | 9/2010 | Chainer | H01L 23/40 257/678 |
| 8,526,186 B2* | 9/2013 | Yokoya | H01L 23/36 165/104.33 |
| 8,772,927 B2 | 7/2014 | Bezama et al. | |
| 9,082,743 B2* | 7/2015 | Hung | H01L 23/3675 |
| 9,437,515 B2 | 9/2016 | Colgan et al. | |
| 9,711,427 B2* | 7/2017 | Lin | H01L 23/3677 |
| 2003/0067746 A1* | 4/2003 | Ishimine | H01L 23/373 361/690 |
| 2006/0249852 A1 | 11/2006 | Chiu et al. | |
| 2009/0057881 A1* | 3/2009 | Arana | H01L 23/473 257/714 |
| 2012/0049347 A1* | 3/2012 | Wang | H01L 21/563 257/737 |
| 2013/0270691 A1* | 10/2013 | Mallik | H01L 21/50 257/713 |
| 2014/0225248 A1* | 8/2014 | Henderson | H01L 21/50 257/712 |
| 2015/0162307 A1* | 6/2015 | Chen | H01L 23/3672 257/712 |
| 2015/0255429 A1* | 9/2015 | Katkar | H01L 25/0657 257/712 |
| 2015/0279761 A1* | 10/2015 | Bet-Shliemoun | H01L 23/42 257/714 |
| 2016/0064355 A1* | 3/2016 | Pan | H01L 25/0657 257/704 |
| 2016/0211190 A1* | 7/2016 | Braunisch | H01L 21/52 |
| 2016/0307832 A1* | 10/2016 | Uzoh | H01L 24/10 |
| 2017/0092619 A1* | 3/2017 | Refai-Ahmed | H01L 25/0655 |
| 2017/0162542 A1* | 6/2017 | Chen | H01L 23/3672 |
| 2017/0162550 A1* | 6/2017 | Das | H01L 23/481 |
| 2017/0229373 A1* | 8/2017 | Kim | F25B 21/02 |
| 2017/0287808 A1* | 10/2017 | Braunisch | H01L 21/52 |
| 2017/0372979 A1* | 12/2017 | Gandhi | H01L 23/04 |
| 2018/0005985 A1* | 1/2018 | Hsieh | H01L 23/367 |

* cited by examiner

ELECTRONIC PACKAGE WITH TAPERED PEDESTAL

BACKGROUND

Aspects of the present disclosure relate to electronic packages, more particular aspects relate to electronic packages with electrical components that are thermally connected to pedestal components.

An electronic package may contain electrical components, structural-integrity components, and thermally-conductive components. The structural-integrity components of some electronic packages may include stiffeners. The thermally-conductive components of some electronic packages may include heat spreaders with pedestals.

SUMMARY

Some embodiments of the present disclosure can be illustrated as an electrical package comprising a first substrate with a first substrate surface. A microprocessor chip may be connected to the first substrate surface. The microprocessor chip may comprise a first chip surface that electrically connects to the first substrate surface. The microprocessor chip may also comprise a second chip surface, located opposite the first chip surface. The electrical package may also comprise a heat-spreader assembly. The heat-spreader assembly may comprise a lid section and a contact surface thermally connected to the second chip surface. The heat-spreader assembly may also comprise a pedestal between the contact surface and the lid section. The pedestal may comprise a first end that is located near the contact surface, and a second end that is located near the lid section and that is wider than the first end.

Some embodiments of the present disclosure may be illustrated as a method for assembling an electronic package. The method may comprise adhering a first surface of an electrical component to a first surface of a first substrate. The method may also comprise securing a stiffener to a second surface of a second substrate, and a head-spreader assembly to a third surface of a third substrate. The heat-spreader assembly may comprise a tapered pedestal that thermally connects to a second surface of the electrical component. The method may also comprise performing reflow soldering on the electronic package.

Some embodiments of the present disclosure may also be illustrated as a method for transferring heat through a tapered pedestal in an electronic package. The electronic package may comprise a substrate with a first substrate surface, and a microprocessor chip connected to the first substrate surface. The microprocessor chip may comprise a first chip surface that electrically connects to the first substrate surface, and a second chip surface located opposite the first chip surface. The electronic package may also comprise a heat-spreader assembly. The heat-spreader assembly may comprise a lid section, and a contact surface thermally connected to the second chip surface. The heat-spreader assembly may also comprise a pedestal between the contact surface and the lid section. The pedestal may comprise a first end that is located near the contact surface, and a second end that is located near the lid section. The second end may be wider than the first end.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to electronic packages, more particular aspects relate to electronic packages with electrical components that are thermally connected to lid components. While the present disclosure is not necessarily limited to such applications, various aspects of the disclosure may be appreciated through a discussion of various examples using this context.

Electronic packages, such as packages containing a microprocessor chip and attached circuit board, typically include electrical contacts by which the electrical components of the package are connected. For example, a microprocessor die may be connected to an interposer circuit board (also referred to as a chip-carrier) by a ball-grid (C4) or pillar-grid (Cu-pillar) array, wherein solder balls serve as a contact through which electrical current may be carried from contact pads on the interposer circuit board to contact pads on the microprocessor chip, and from the microprocessor chip to the interposer circuit board.

The interposer circuit board may be connected to a mother board by a ball-grid array (BGA) wherein solder balls serve as a contact through which electrical current may be carried from contact pads on the circuit board to contact pads on the microprocessor chip, and from the microprocessor chip to the circuit board.

In other package designs, springs or pins on an interposer circuit board may align with contact pads in a socket designed to accept the interposer circuit board, or, alternatively, springs or pins in the socket assembly may align with contact pads on the interposer circuit board surface.

For package designs in which some package contents are connected through a solder medium, package components are secured together by a reflow solder process. In reflow soldering, electrical components are first temporarily secured together with solder paste, a solder-containing compound. The electrical components are temporarily secured in a position in which electronic current may travel through the electronic contacts (e.g., contact pins and pads) on those connected components. This temporary positioning is typically followed by the electrical package being heated to temperatures sufficient to melt the solder in the solder paste. Upon cooling, the solder forms a more permanent bond between electrical components.

However, some package designs may include electrical components that may, due to thermal expansion, change shape during the heating and cooling process of reflow soldering. For example, some components may expand at a particular rate when exposed to a particular amount of heat, whereas others may expand at a lesser or greater rate when exposed to that amount of heat. Similarly, due to differences in thermal capacity or thermal conductivity, some components may heat and cool at rates that may be greater or lesser than the heating and cooling rates of other components in the package, causing those components to expand and contract at different times. Other components may warp (e.g., bend) due to, for example, differences in thermal expansion coefficients or thermal conductivity of the distributed sub components of those components (e.g., layers or traces in a chip or board) or differences in the heat distribution throughout component during the reflow process (e.g., due to unequal distribution of solder flux, shape of the component, or unequal thermal capacities of sub components).

These, or other changes in shape, may be significant enough to result in one or more electrical components no longer making complete contact with another electrical component in the package. For example, a processor chip may warp at a different rate than an interposer to which that chip is attached through a ball-grid array. This may cause poor electrical contact between one or more of the solder balls and one or more of the contact pads on the interposer or one or more contact pads on the chip. In some instances this may cause the processor assembly to function in a sub-optimal manner, whereas in others it may cause the processor to be non-functional.

In order to address potential issues with these shape changes and warpage, some electrical packages may be designed with one or more stiffeners. These stiffeners may be designed to increase the rigidity of the processor package in order to resist shape changes (e.g., warpage) associated with reflow soldering. These stiffeners may be composed of, for example, a metal material with thermal expansion properties that cause the stiffener to expand at rate that is sufficient enough to cause the stiffener to press against other components during the reflow process. In other instances, these stiffeners may be composed of a material that resists any shape change due to the heat of reflow soldering, but that is positioned to provide rigidity to other components to prevent those other components from changing shape as well.

In some instances it may be beneficial to include stiffeners that extend beyond the height of the electrical components in a package. For example, a stiffener in a microprocessor package may be attached to the same interposer board as a processor die or processor dies, but may extend above the height of the processor die(s). This added height and associated mass of such a stiffener may, in some designs, make it more effective at preventing shape changes than a stiffener that is of equal or lower height as a processor die.

However, in some package designs, stiffeners may create a gap between electrical components and a heat-conducting lid (e.g., a "heat spreader") of the package. For example, a stiffener that expands higher than a processor die may create a gap between the die and the lid of the package. This gap may significantly limit the ability of heat to flow from the processor die to the heat-conducting lid while the processor is being used. This may, in turn, lead to the processor accumulating heat to the point at which it becomes unstable. In such package designs, the lid assembly may include a pedestal section that extends from the lid section to the processor die, such that the lid section makes contact with the processor die via the pedestal section. In these designs, the pedestal may serve as a medium through which heat may be transferred from the processor die to the remainder of the lid and to other heat-distribution components (e.g., heatsinks, heat fins, coolant).

Pedestal contact with the electrical components of a package may or may not be through an intermediary. Contact without an intermediary may be through pressure (e.g., the surfaces of the components may be pressed against each other). Contact through an intermediary may be through, for example, a thermal interface material, such as solder, thermal paste, or others. Similarly, in some package designs a pedestal may be completely integrated into a lid of the package (i.e., the lid and pedestal may all be a single, continuous material), whereas in other package designs the pedestal section may be connected to a lid section (e.g., a pedestal may be soldered or otherwise fused to a heatspreader lid, or may be temporarily connected through a thermal-interface material, such as a thermal paste).

In package designs in which the lid of the package includes (or is connected to) a pedestal, heat may flow out of electrical components through the pedestal, but the vertical nature of the pedestal may limit the extent to which heat may spread horizontally to other heat-distribution components. This may limit the effectiveness of some heat-distribution components at cooling those electrical components. For example, a heat sink with short, wide fins may be insufficiently effective at cooling an electronic package with a pedestal that directs most of the heat from the package's electronic components to the center of those wide fins.

Some embodiments of the present disclosure may improve upon electrical-package designs by including pedestal sections that are designed to distribute heat horizontally as well as vertically. In some embodiments the pedestal may be a tapered shape that allows heat to spread horizontally through the pedestal as it spreads vertically through the pedestal.

Some embodiments of the present disclosure may also include stiffeners that are designed to account for the shape of the pedestal. In some such embodiments, the stiffener may be positioned significantly far away from electrical components (e.g., horizontally distant from a processor die on an interposer circuit board) to avoid interference with the pedestal shape. In other such embodiments, the stiffener shape may complement the shape of the pedestal, allowing for contact between the pedestal and stiffener upon thermal expansion during reflow soldering. In these embodiments, an exact complementary shape is not necessarily contemplated. Rather, a shape that is designed to account for the pedestal taper, in some fashion, is contemplated, even if no surface of the stiffener precisely corresponds to a surface of the pedestal. In some embodiments, the stiffener may be located near the electrical components to which the pedestal connects in order to provide stiffening pressure to those components.

Figure 1A:
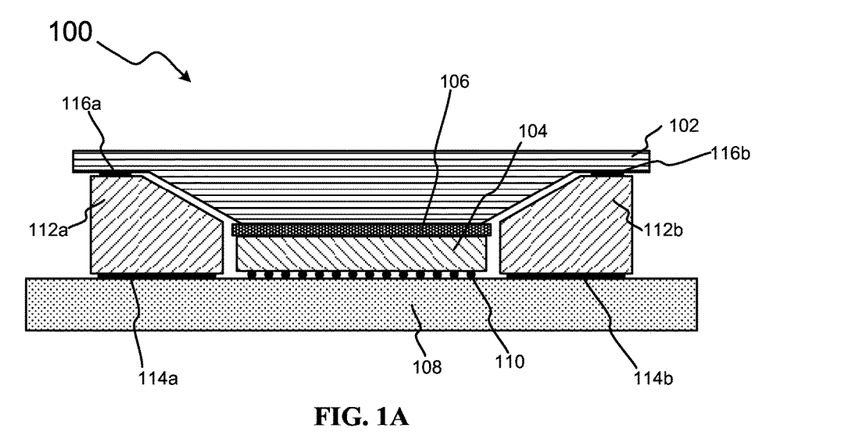
FIG. 1A illustrates a cross section of a design of a 2-D electronic package that includes a pedestal that is shaped to distribute heat horizontally, in accordance with embodiments.

FIG. 1A illustrates a cross-section of one embodiment of a design of a 2-D electronic package, package 100, that includes a pedestal that is shaped to distribute heat horizontally. Lid 102 of package 100 includes a pedestal. While, in this embodiment, lid 102 and the incorporated pedestal are represented as one physical entity (i.e., one continuous material), in other embodiments lid 102 may be physically separate from the pedestal, and may be connected structurally through a contact medium (e.g., solder) that may allow thermal conduction between lid 102 and the pedestal.

The pedestal of lid 102 makes contact with a processor chip 104 through contact medium 106. In some embodiments contact medium 106 may represent a bond, such as a chemical adhesive or solder, a thermal-interface material without significant bonding properties, such as thermal paste or gel, or a direct contact between lid 102 and chip 104. Chip 104 makes contact with substrate 108 through contact medium 110. Substrate 108 may be an interposer circuit board that is designed to act as an intermediary between chip 104 and a circuit board (e.g., a motherboard) to which package 100 is connected. Contact medium 110 is presented here as a ball grid array of solder balls, but in other embodiments may be other contact media capable of maintaining an electrical connection between chip 104 and substrate 108, such as contact pins.

Located proximate to chip 104 are stiffeners 112a and 112b. In some embodiments, stiffeners 112a and 112b may be portions of a cross-sectional view of a single stiffener, or may be two of two or more stiffeners built into the package. For example, in some embodiments stiffeners 112a and 112b may actually be cross-sectional views of a single stiffener that forms a perimeter (e.g., a square or rectangular perimeter) around chip 104. In other embodiments stiffeners 112a and 112b may be physically separate, and may or may not be joined through a connection medium. In yet other embodiments only a single of stiffener 112a and 112b may be present, such that the perimeter around chip 104 is not completely enclosed by a single or multiple stiffeners.

Stiffeners 112a and 112b are structurally connected to substrate 108 through connections 114a and 114b respectively. In some embodiments connections 114a and 114b may be made using a physical bond between materials (e.g., solder), an adhesive (e.g, a chemical adhesive), or a mechanical connection (e.g., a screw and socket). Similarly, stiffeners 112a and 112b are structurally connected to lid 102 through connections 116a and 116b. Connections 116a and 116b may be similar, but not necessarily the same, types of connections as 114a and 114b. In some embodiments, connections 114a and 114b and connections 116a and 116b may not be electrically or thermally conductive, but may rather function to supply the necessary structural integrity for stiffeners 112a and 112b and lid 102 to prevent shape changes of package 100.

In this illustration, stiffeners 112a and 112b are shaped complementary to the shape of the pedestal of lid 102. This may cause the tapered surfaces of stiffeners 112a and 112b to press against or be pressed against by the tapered surface of the pedestal of lid 102 during thermal expansion. This may, for example, aid in the stiffening abilities of stiffeners 112a and 112b, increasing their ability to prevent shape changes to package 100. In other embodiments the tapered sections of stiffeners 112a and 112b and the pedestal of lid 102 may not physically touch during thermal expansion, but stiffeners 112a and 112b may be tapered at a shape that is complementary to the shape of the pedestal of lid 102 in order to provide sufficient space in package 100 for the added size of the pedestal of lid 102 (e.g., the added size caused by the tapered shape of the pedestal).

Figure 1B:
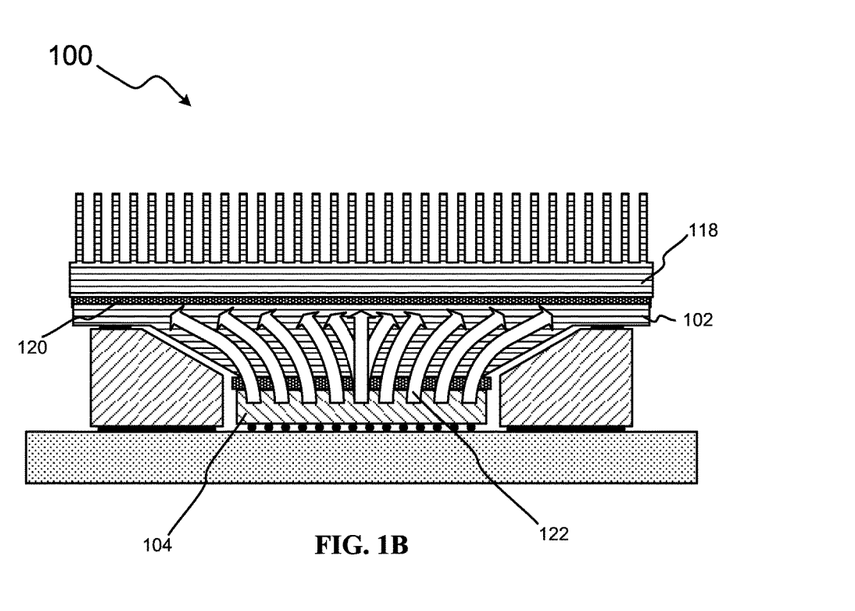
FIG. 1B illustrates an example of heat propagating through the electronic package of FIG. 1A, in accordance with embodiments.

FIG. 1B illustrates package 100 attached to a heatsink 118. Heatsink 118 is thermally connected to lid 102 through connection medium 120. In some embodiments connection medium 120 may also create a structural connection between heatsink 118 and lid 102. For example, in some embodiments the connection medium may be a soldered connection. In other embodiments connection medium 120 may serve only to facilitate heat transfer from lid 102 to heatsink 118. For example, in some embodiments connection medium 120 may be a thermal paste or thermal liquid.

Arrows 122 illustrate example pathways through which heat may travel from chip 104 to lid 102. As is shown by the path of arrows 122, the pedestal of lid 102 allows heat to spread horizontally as it spreads through lid 102 and vertically away from chip 104. In this way, the pedestal of lid 102 facilitates the spreading of heat horizontally throughout lid 102 at the point at which lid 102 connects with heat spreader 118, thus making better use of the horizontal surface area of heat sink 118 and the fins located further from the center of heat sink 118 and lowering the operating temperature of the microprocessor chip. This may be particularly beneficial in cases in which the chip 104 produces a high amount of heat or when heat sink 118 is required to be a short, wide heat sink with many short fins over a wide horizontal area rather than tall fins over a smaller horizontal area (e.g., in enclosures with limited clearance above package 100).

As discussed, FIGS. 1A and 1B illustrates one embodiment of a design of a 2-D electronic package that utilizes a pedestal that is shaped to distribute heat horizontally. However, in some embodiments a similar pedestal design may be utilized in other package designs.

Figure 2:
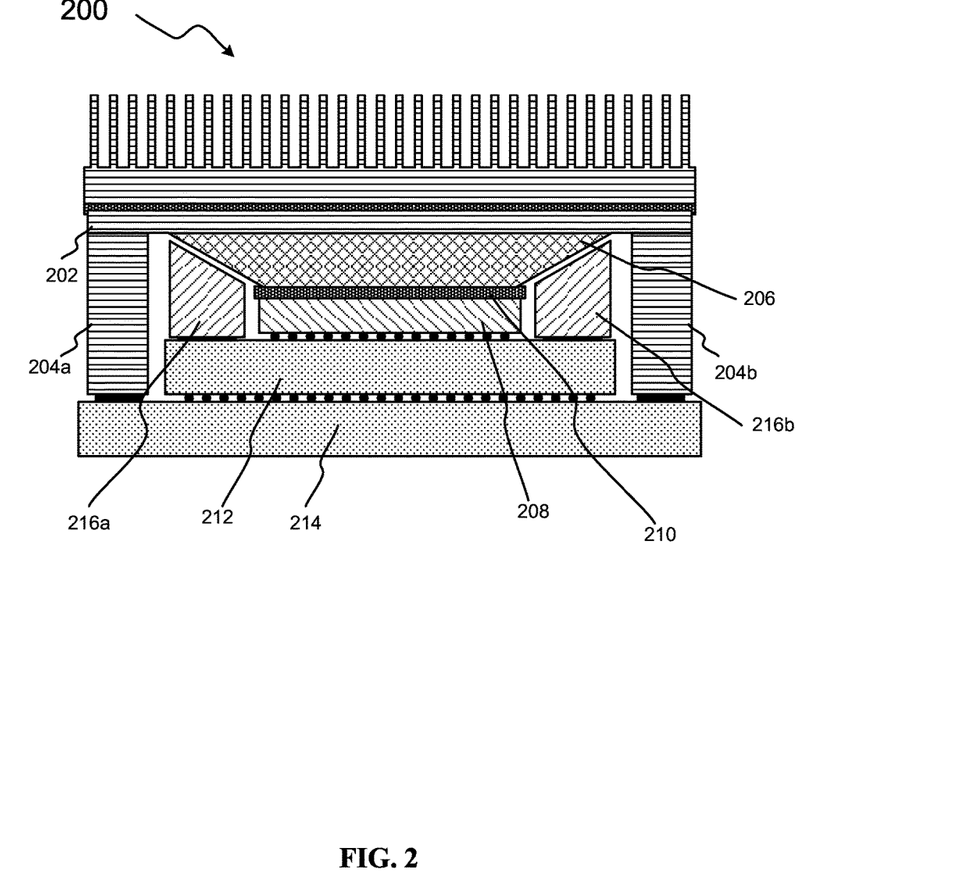
FIG. 2 illustrates a cross section of a design of a 3-D electronic package that utilizes a pedestal that is shaped to distribute heat horizontally, in accordance with embodiments.

FIG. 2 illustrates one embodiment of a cross section of a design of a 3-D electronic package that utilizes a pedestal that is shaped to distribute heat horizontally. Package 200 includes a lid with heat-spreader section 202 and support sections 204a and 204b. In some embodiments heat-spreader section 202 and support sections 204a and 204b may all be one physical entity, or may be separate pieces that are structurally connected (e.g., through solder, welding, adhesive, etc.). Heat-spreader section 202 connects with pedestal 206. In some embodiments heat-spreader section 202 and pedestal 206 may together be one physical entity, or may be separate pieces that are structurally connected. The connection between heat-spreader section 202 and pedestal 206 may be designed to facilitate the transfer of heat from pedestal 206 to heat-spreader section 202.

As shown, pedestal 206 contacts chip 208 through contact medium 210. Contact medium 210 may represent a thermally conductive medium. In other embodiments, contact medium 210 may represent direct contact between the surfaces of pedestal 206 and chip 208. Chip 208 is connected to substrate 212. Substrate 212 is also connected to a second substrate 214. The connections between chip 208, substrate 212, and substrate 214 may be, as is illustrated here, a ball grid array. However, one or both of these connections may be through contact springs or pins, or other method by which electrical current may be transmitted between chip 208, substrate 212, and substrate 214.

In the illustrated embodiment, stiffeners 216a and 216b are structurally connected to substrate 212. As illustrated, stiffeners 216a and 216b do not contact pedestal 206 or heat-spreader section 202. However, as illustrated, the shape of stiffeners 216a and 216b do complement the shape of pedestal 206. In some embodiments, the thermal-expansion properties of stiffeners 216a and 216b, pedestal 206, or all, may cause the tapered surfaces of pedestal 206 to come into physical contact (i.e., to be physically connected) with the tapered surfaces of stiffeners 216a and 216b. This may facilitate the ability of stiffeners 216a and 216b to prevent shape changes to package 200. As illustrated here, the cross-section of stiffeners 216a and 216b (which, as discussed in relation to FIG. 1a, may be the same physical object, such as a stiffener that forms a perimeter around chip 208) is presented as a 4-sided polygon. However, in some embodiments other stiffener designs may be possible while still complementing the shape of pedestal 206. For example, stiffeners 216a and 216b may be designed such that their cross section is a triangle, the angled top of which may complement the shape of pedestal 206.

In the embodiments discussed in connection with FIGS. 1A, 1B, and 2, stiffener designs that complement the tapered shape of a pedestal are illustrated. However, in some embodiments an electronic package may contain a pedestal that is shaped to allow heat to distribute horizontally through the pedestal, but may also contain stiffeners that are not shaped to complement the shape of the pedestal.

Figure 3:
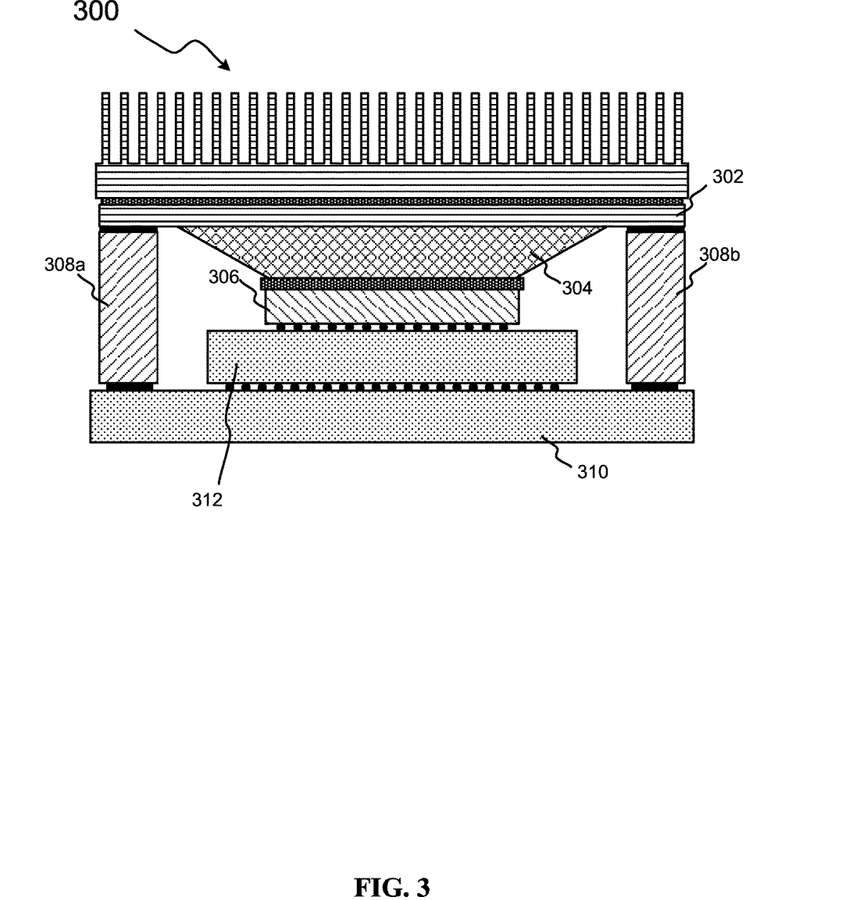
FIG. 3 illustrates a cross section of a second design of a 3-D electronic package that utilizes a pedestal that is shaped to distribute heat horizontally, in accordance with embodiments.

FIG. 3 illustrates one embodiment of a cross section of a design of a 3-D electronic package 300 that utilizes a pedestal that is shaped to distribute heat horizontally and stiffeners that are not shaped to complement the pedestal. Package 300 contains lid 302. Lid 302 is connected to pedestal 304, which is shaped to facilitate horizontal heat distribution as heat flows away from chip 306.

Package 300, as illustrated, also contains stiffeners 308a and 308b, which may or may not be the same physical object. Stiffeners 308a and 308b are structurally connected to lid 302 and substrate 310. These structural connections may enable stiffeners 308a and 308b to provide support to package 300, and thus prevent warping of the overall package. However, as illustrated stiffeners 308a and 308b may not provide complete support to chip 306 or substrate 312. Thus, in some embodiments further stiffeners may be implemented (e.g., attached to substrate 312) to add more structural integrity to package 300 during reflow soldering.

In some embodiments, the stiffeners 308a and 308b may be integral to the heat spreader 302 forming one physical entity. Further, in some discussed embodiments, an electronic package may contain a stiffener that forms a perimeter around an electrical component of the package. This may occur in both 2-D electronic packages and 3-D electronic packages.

Figure 4:
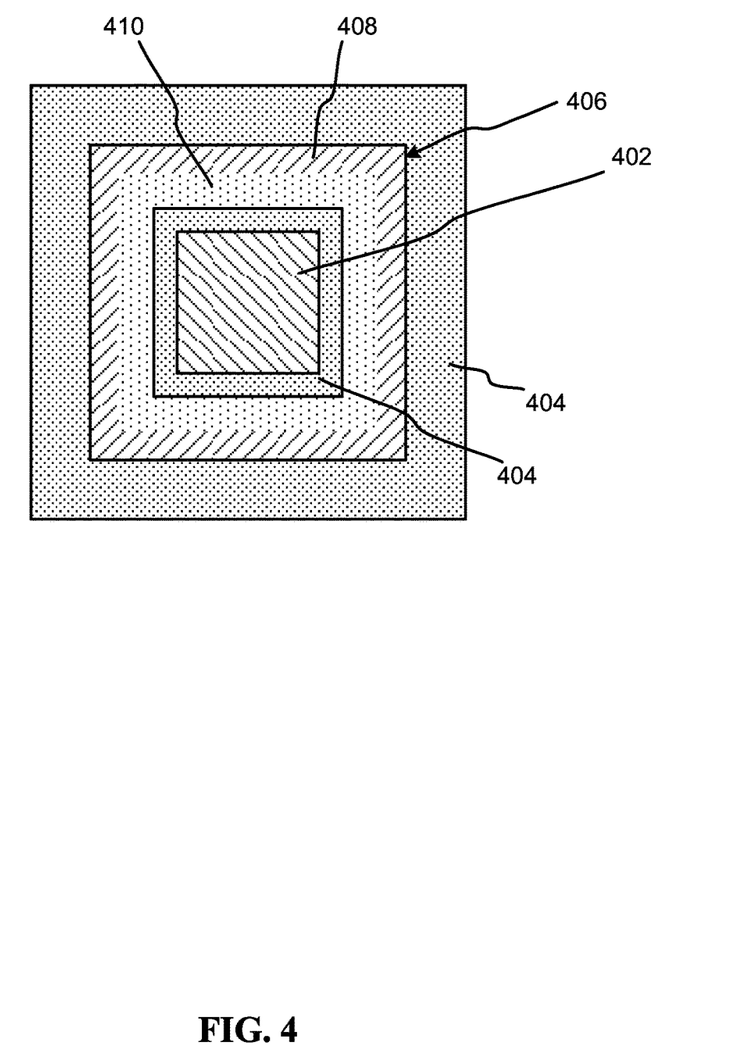
FIG. 4 illustrates a top-down representation of a 2-D electronic package design in which a single stiffener forms a perimeter around an electrical component, in accordance with embodiments.

FIG. 4 illustrates a top-down representation of a 2-D electronic package design in which a single stiffener forms a perimeter around an electrical component. In FIG. 4, component 402 is electronically connected to substrate 404. Stiffener 406 is structurally connected to substrate 404, forming a perimeter around component 402. As illustrated, Stiffener 406 contains two sections—a flat section 408 that is shaped to structurally connect to a head-spreader section of a lid, and a tapered section 410 that is shaped to complement a tapered pedestal. While, as illustrated here, a significant portion of substrate 404 is visible on either side of stiffener 406, in some embodiments the inner edge of tapered section 410 of stiffener 406 may be positioned closer to the outer edge of component 402, and the outer edge of flat section 408 may be positioned closer to or at the outer edge of substrate 404.

Figure 5:
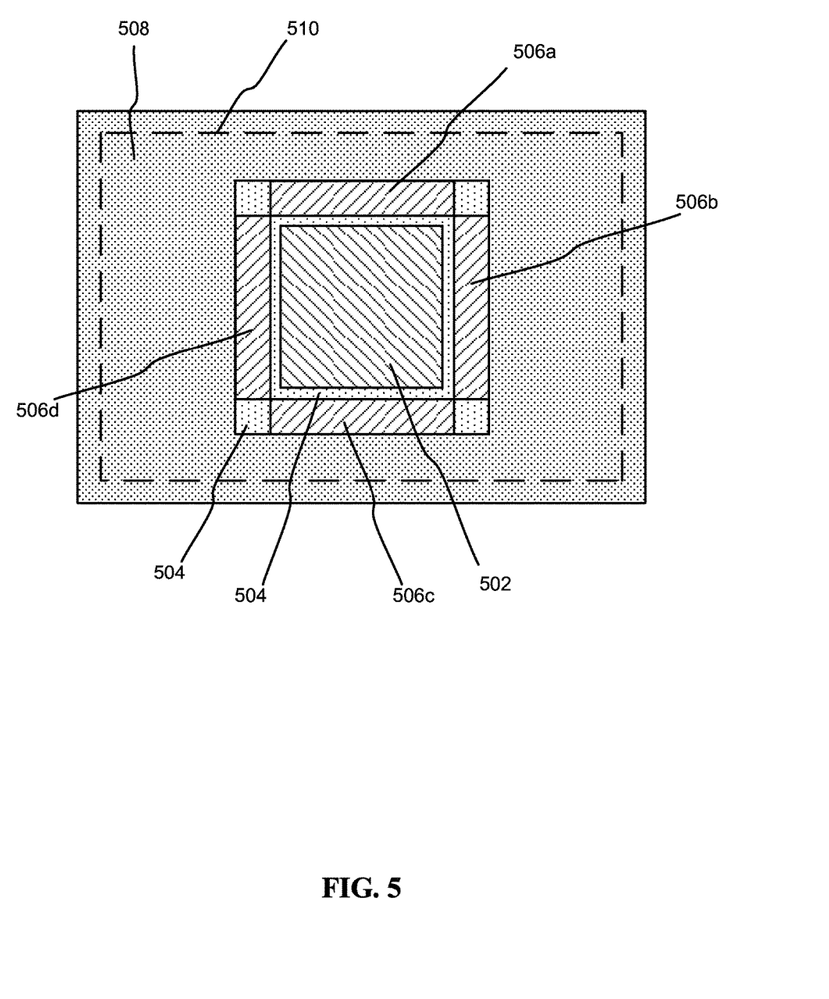
FIG. 5 illustrates a top-down representation of a 3-D electronic package design in which multiple stiffeners form a perimeter around an electrical component, in accordance with embodiments.

FIG. 5 illustrates a top-down representation of a 3-D electronic package design in which multiple stiffeners form a perimeter around an electrical component. Component 502 is connected (e.g., electrically, structurally, or both) to substrate 504. Component 502 may represent, in some embodiments, a processor chip or one or more processor dies. At least a partial perimeter is formed by stiffeners 506a-d. In some embodiments, one or more of stiffeners 506a-d may be shaped (e.g., tapered) to complement the shape of a pedestal that is designed to connect (e.g., thermally) with component 502. In some embodiments, one or more of stiffeners 506a-d may either not be shaped to complement the shape of such a pedestal, or may be omitted from the package design entirely. For example, in some package designs, shape changes to the package components may only be expected in certain directions (e.g., the left or right edges of component 502, as presented here, may be expected to warp into or out of the page, but shape changes in any other directions are not expected). In such embodiments, only the stiffeners to prevent those shape changes may be utilized (e.g., continuing the previous example, only stiffeners 506b and 506d may be utilized).

Substrate 504 may be connected (e.g., electrically and structurally) to substrate 508. Shown on substrate 508, as illustrated, is connection indicator 510. In this illustration, connection indicator 510 indicates the points of connection of, for example, a processor lid to substrate 508. In some embodiments connection indicator 510 may mark solder points at which a processor lid may be attached, or potential holes into which a processor lid may be screwed or bolted. In other embodiments, connection indicator 510 may represent the connection point of an additional stiffener. Such a stiffener may help to prevent warpage of substrate 508.

FIGS. 1A, 1B, 2, and 3 illustrate electrical package designs that incorporate a pedestal with an even (e.g., straight and angular) taper. However, in some embodiments pedestal tapers may be of multiple different shapes. In those embodiments, stiffeners utilized in the package designs may or may not have a surface that is shaped to correspond to the pedestal taper.

Figure 6A:
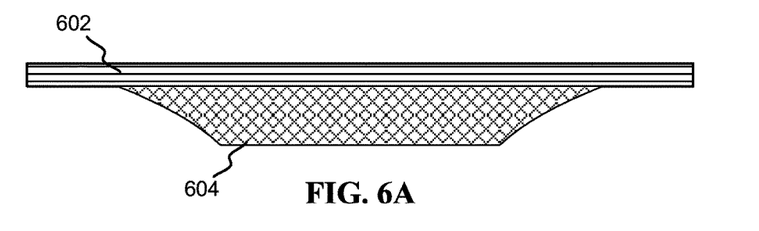
FIG. 6A illustrates a pedestal with a concave taper, in accordance with embodiments.
Figure 6B:
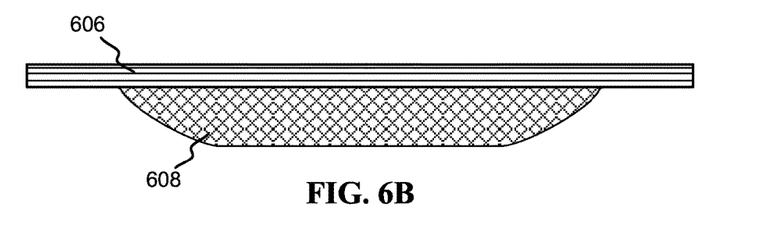
FIG. 6B illustrates a pedestal with a convex taper, in accordance with embodiments.
Figure 6C:
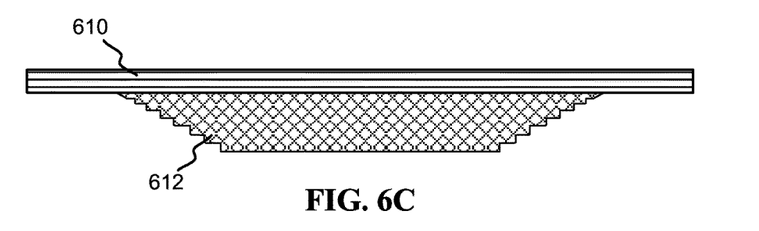
FIG. 6C illustrates a pedestal with a step taper, in accordance with embodiments.

FIG. 6A illustrates package lid 602 that is connected (e.g., thermally and structurally) to pedestal 604. Pedestal 604 is illustrated with a concaved taper. FIG. 6B illustrates a package lid 604 that is connected to pedestal 608. Pedestal 608 is illustrated with a convex taper. In some embodiments the curve of the taper of pedestals 604 and 608 may be greater or lesser than what is illustrated in FIGS. 6A and 6B, respectively. FIG. 6C illustrates package lid 610 that is connected to pedestal 612. Pedestal 612 is illustrated with a step taper. In some embodiments, more or fewer steps may be present in the tapered surface of pedestal 612.

Figure 6D:
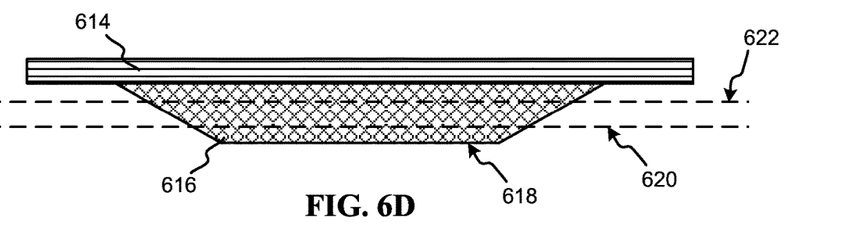
FIG. 6D illustrates a pedestal with an even taper, in accordance with embodiments.

In some embodiments, pedestal taper may be characterized as an increase in a cross-sectional area of the pedestal that corresponds to an increase in the distance from the electrical component with which that pedestal is connected. For example, FIG. 6D illustrates a package lid 614 that is connected to pedestal 616. Pedestal 616 is illustrated with a straight taper. In some embodiments the angle of the taper, with respect to lid 614 or contact surface 618 (i.e., the surface that connects to an electrical component) may be greater or lesser than what is illustrated. Regardless of the angle, the taper may be characterized by the increase the cross-sectional area of pedestal 616 as the distance between a given point on pedestal 616 and contact surface 618 increases. For example, a plane may intersect the pedestal at indicator line 620. This plane may be parallel to a plane that corresponds to contact surface 618 and to the surface of the electrical component to which contact surface 618 connects. The cross-sectional area of the pedestal at the intersection of the plane with the pedestal (at indicator line 620) may be X cm$^2$ (e.g., 6 cm$^2$). However, if the plane were located at indicator line 622, the cross sectional area of the pedestal at the intersection of the plane with the pedestal (at indicator line 622) may be 1.5X cm$^2$ (e.g., 9 cm$^2$). Thus, the pedestal taper may be characterized by an increase in cross-sectional area of the pedestal at the intersection of the pedestal with a plane if that increase corresponds to an increase in distance between the plane and the pedestal's contact surface. In some embodiments, as illustrated in FIG. 6D, those two increases may be directly proportional. In other embodiments, as illustrated in FIGS. 6A and 6B, the increase of the cross-sectional area may change at a different rate depending on the distance from the contact surface.

In some embodiments, processor lids 602, 606, 610, and 614 of FIGS. 6A-6D may be physically the same structure (e.g., the lid and pedestal may be composed of one continuous material) as pedestals 604, 608, 612, and 616, respectively. In other embodiments, processor lids 602, 606, 610, and 614 may be separate physical structures from pedestals 604, 608, 612, and 616 but may be connected to pedestals 604, 608, 612, and 616, respectively. For example, processor lid 602 may be soldered to pedestal 604, processor lid 606 may be welded to pedestal 608, and processor lid 610 may be adhered to pedestal 612 (e.g., through a chemical adhesive). In some embodiments the connections between the processor lids 602, 606, 610, and 614 and pedestals 604, 608, 612, and 616 may be designed to facilitate thermal conductivity between the processor lids and the pedestals. Throughout this disclosure, and to the extent that it is consistent with the embodiments of this disclosure, a heat-spreader assembly is contemplated to include a lid and pedestal, regardless of whether the lid and pedestal are physically the same structure or separate physical structures.

In some embodiments, a combination of any pedestal taper design illustrated by FIGS. 1-3 and 6A-6D may be utilized. For example, some embodiments may utilize a pedestal that is a combination of a flat taper and a concave taper, or a convex taper and a step taper. Further, the embodiments of this disclosure are not intended to be limited to the specific taper shapes disclosed herein.

Figure 7:
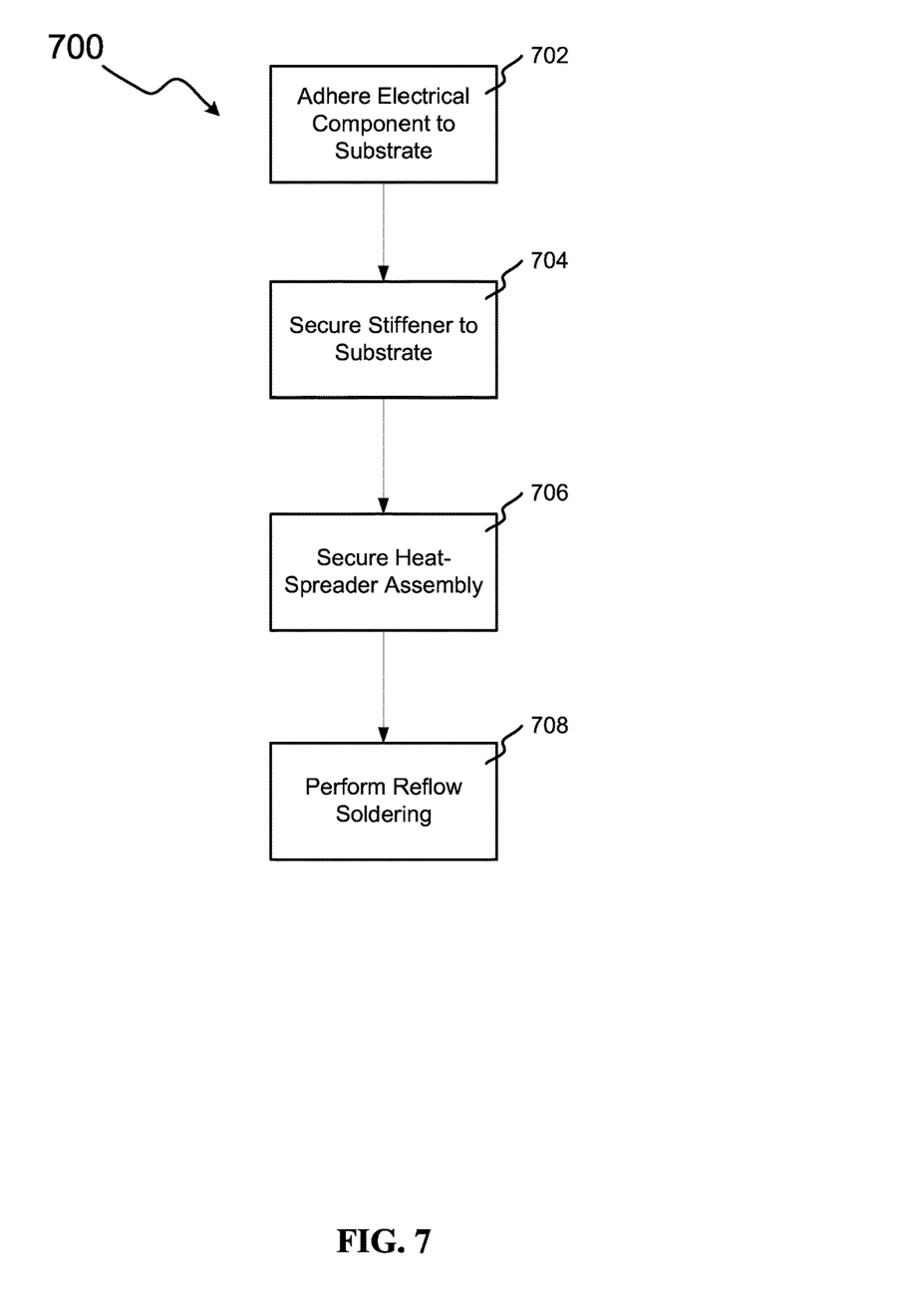
FIG. 7 illustrates an example method of assembling an electrical package with a tapered pedestal, in accordance with embodiments.

FIG. 7 illustrates an example method 700 by which an electrical package consistent with the embodiments of the present disclosure may be assembled. In block 702, an electrical component (or multiple electrical components) is adhered to a substrate. In some embodiments this electrical component may be a processor chip, and the substrate may be an interposer. This adhering process may result in a temporary structural connection that may become more permanent upon reflow soldering.

In block 704, a stiffener (or multiple stiffeners) may be secured to a substrate. In some embodiments this stiffener may form a perimeter around the electrical component, and may be secured to the same substrate as the electrical component. In some embodiments this securing process may result in a structural connection that is sufficiently strong to allow the stiffener to partially or completely prevent shape changes to the electrical component, substrate, and other components of the electrical package during reflow soldering. In some embodiments this stiffener may be shaped to complement the shape of a tapered pedestal. In some embodiments, block 704 may precede block 702, such that a stiffener is secured to the substrate before the electrical component is adhered to the substrate.

In block 706, a heat-spreader assembly is secured to the package. This heat spreader assembly may include a pedestal that is shaped to facilitate the spread of heat horizontally through the pedestal. In some embodiments, the heat-spreader assembly may be secured to the same substrate to which the electrical component is adhered. In other embodiments the heat-spreader assembly may be secured to a different substrate. In yet further embodiments, the heat-spreader assembly may be secured to the stiffener. The pedestal of the heat spreader may include a contact surface that thermally connects to an electrical component of the package. In some embodiments, this securing process may result in a structural connection that is sufficiently strong to allow the heat-spreader assembly to partially or completely prevent shape changes to the electrical package during reflow soldering.

In block 708, reflow soldering is performed on the electrical package. In some embodiments, reflow soldering may cause the structural connections of the components of the package to become less temporary (i.e., more permanent) than before reflow soldering.

While method 700 is discussed herein with relation to several example components and designs, it should be understood that method 700 is contemplated to be applicable to any processor package that is consistent with the present disclosure. In other words, any processor package that is consistent with this disclosure may, in some embodiments, be able to be assembled by the process illustrated by FIG. 7.

Further, method 700 is not intended to necessarily be limited to the exact order of blocks 702-708 as illustrated. For example, in some embodiments a heat-spreader assembly may be secured to the electrical package after a reflow-soldering process strengthens the structural connections between some electrical components of the package, and potentially some stiffeners of the package. This may be beneficial, for example, in embodiments in which the heat-spreader assembly is not designed to partially or completely prevent shape changes to the electrical package during reflow soldering. In other embodiments, for example, multiple stages of reflow soldering may be performed. For example, one or more electrical components and one or more stiffeners may be adhered to a substrate, followed by a stage of reflow soldering. Subsequently, further electrical components and stiffeners may be adhered to a substrate, followed by a further stage of reflow soldering.

Figure 8:
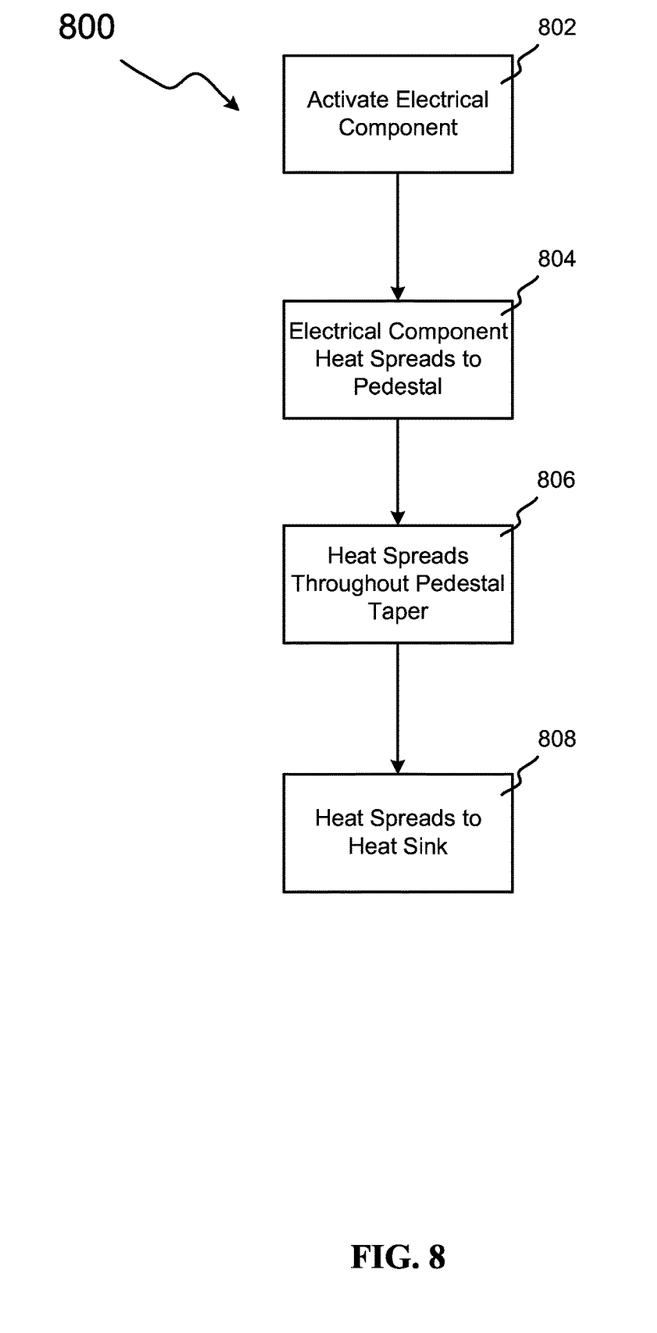
FIG. 8 illustrates an example method of transferring heat through a tapered pedestal in an electronic package, in accordance with embodiments.

FIG. 8 illustrates a method by which heat may be transferred through a tapered pedestal in an electronic package, such as a package illustrated by FIGS. 1A, 1B, 2, and 3. In block 802, an electrical component of an electrical package is activated. In some embodiments this may comprise applying power to a processor chip in the electrical package. In some embodiments, the electrical package may be installed in a larger system, such as a motherboard.

In block 804, heat from the electrical component spreads from the electrical component to a tapered heat-spreader pedestal through a thermal connection between the electrical component and the heat-spreader pedestal. For example, a processor chip and a tapered heat-spreader pedestal may be thermally connected with a thermal pad or thermal paste. Heat that is produced by that processor chip during operation may be conducted to the thermal paste, and from the thermal paste to the pedestal.

In block 806, the heat from the electrical component spreads throughout the pedestal. This may include spreading horizontally through the taper of the pedestal as it spreads vertically through the pedestal.

In block 808, the heat spreads from the heat-spreader pedestal to a heat sink. In some embodiments this may also be through a thermal paste or pad. In some embodiments the heat may be transferred to the heat sink to a lid section of a heat spreader that is attached to the heat-spreader pedestal. In some embodiments the heat may be transferred to the heat sink through most of or the entire horizontal (i.e., cross-sectional) surface are of the tapered pedestal. In some embodiments, this heat sink may be a metallic base with fins to facilitate transfer of the heat from the fins to a surrounding medium. In some embodiments, this heat sink may be part of a liquid-cooling system. The particular form or function of the heat sink may not be essential to the operation of method 800.

Some embodiments of the present disclosure refer to some components being connected to other components. In some instances, the present disclosure specifies the nature of those connections (e.g., thermally connected through a thermal pad, mechanically connected using a bolt and socket, electrically connected through electrical contacts). In instances in which a connection type is specified, functional equivalents of that connection type are also contemplated. In instances in which at least one example of a connection type is given, any connection type fitting within the nature of that at least one example is also contemplated. In instances in which no connection type is specified and no example of connection types are given, any connection type fitting within the nature of the examples provided within this disclosure, and their functional equivalents, is contemplated.

In instances in which a connection type between components is specified, or at least one example of a connection type is given, the possibility of further connection types between those components is also contemplated unless it is specified otherwise or those further connection types would be impossible, unfeasible, or impractical within the bounds of this disclosure. For example, a statement noting that two components are connected electrically (e.g., by a ball grid array) does not foreclose the possibility that those components are also connected thermally (e.g., by a thermal paste or thermal pad). Further, where that electrical connection also provides a second connection type (e.g., a structural connection) between those two components (e.g., a pin soldered through a through-hole socket may provide both an electrical connection and a structural connection), further connections of either type may also be present between those two components (e.g., a second electrical connection or structural connection).

Finally, a connection between two components, regardless of type and unless otherwise specified (or impossible/unfeasible), may be due to connection through a medium (e.g., a structural connection through an adhesive), or may be a direct connection between those components (e.g., a physical or thermal connection due to two surfaces of the components contacting each other directly).

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

What is claimed is:
1. An electrical package comprising:
a first substrate with a first substrate surface;

at least one microprocessor chip connected to the first substrate surface, the microprocessor chip comprising:
a first chip surface that electrically connects to the first substrate surface; and
a second chip surface located opposite the first chip surface; and
a heat-spreader assembly, the heat spreader assembly comprising:
a lid section;
a contact surface thermally connected to the second chip surface;
a pedestal between the contact surface and the lid section, the pedestal comprising:
a first end that is connected to the contact surface; and
a second end that is connected to the lid section, wherein the pedestal is wider at the second end than at the first end.

2. The electrical package of claim 1, further comprising a stiffener, the stiffener comprising:
a complementary stiffener surface that complements a shape of the pedestal, wherein the shape of the pedestal is defined by the first end of the pedestal and second end of the pedestal; and
a lower stiffener surface.

3. The electrical package of claim 2, wherein the stiffener further comprises a top stiffener surface, located opposite the lower stiffener surface with respect to a remainder of the stiffener.

4. The electrical package of claim 3, wherein the lower lid surface of the lid section structurally connects with the top stiffener surface.

5. The electrical package of claim 2, wherein the lower stiffener surface is structurally connected to the first substrate surface.

6. The electrical package of claim 1, wherein the first substrate contains a second substrate surface that is opposite the first substrate surface, and wherein the second substrate surface electrically connects with a second substrate.

7. The electrical package of claim 6, wherein the lower stiffener surface is structurally connected to the second substrate.

8. The electrical package of claim 4, wherein the lower lid surface of the lid section interfaces with the second substrate.

9. The electrical package of claim 1, wherein the pedestal comprises an angled taper between the first end and the second end.

10. The electrical package of claim 1, wherein the second chip surface is substantially parallel to a first plane, and wherein an increase in the distance between the contact surface and the intersection of a second plane with the pedestal corresponds to an increase in a cross-sectional area of the pedestal at the intersection, wherein the second plane is parallel to the first plane.

11. A method of assembling an electronic package, the method comprising:
adhering a first surface of an electrical component to a first surface of a first substrate;
securing a stiffener to a second surface of a second substrate;
securing a heat-spreader assembly to a third surface of a third substrate, wherein the heat-spreader assembly comprises a tapered pedestal that thermally connects to a second surface of the electrical component; and
performing reflow soldering on the electronic package.

12. The method of claim 11, wherein the second substrate is the same as the first substrate, and wherein the second surface of the second substrate is the same as the first surface of the first substrate.

13. The method of claim 12, wherein the third substrate is the same as the first substrate, and wherein the third surface of the third substrate is the same as the first surface of the first substrate.

14. The method of claim 11, wherein the performing the reflow soldering occurs before the securing the head-spreader assembly.

15. The method of claim 11, wherein the tapered pedestal comprises a convex taper.

16. A method comprising:
transferring heat through a tapered pedestal in an electronic package, the electronic package comprising:
a first substrate with a first substrate surface;
a microprocessor chip connected to the first substrate surface, the microprocessor chip comprising:
a first chip surface that electrically connects to the first substrate surface; and
a second chip surface located opposite the first chip surface; and
a heat-spreader assembly, the heat-spreader assembly comprising:
a lid section;
a contact surface thermally connected to the second chip surface;
a pedestal between the contact surface and the lid section, the pedestal comprising:
a first end that is located near the contact surface; and
a second end that is connected to the lid section, wherein the pedestal is wider at the second end than at the first end.

17. The method of claim 16, wherein the package further comprises a stiffener, the stiffener comprising:
a complementary stiffener surface that complements a shape of the pedestal, wherein the shape of the pedestal is defined by the first end of the pedestal and second end of the pedestal; and
a lower stiffener surface.

18. The method of claim 17, wherein the stiffener further comprises a top stiffener surface, located opposite the lower stiffener surface with respect to a remainder of the stiffener.

19. The method of claim 16, wherein first end of the pedestal is adjacent to the contact surface, and wherein the second end of the pedestal is adjacent to the lid section.

20. The method of claim 16, wherein the tapered pedestal comprises a step taper.

* * * * *